(12) United States Patent
Lee et al.

(10) Patent No.: US 11,152,304 B2
(45) Date of Patent: Oct. 19, 2021

(54) SEMICONDUCTOR PACKAGE

(71) Applicant: SAMSUNG ELECTRONICS CO., LTD., Suwon-si (KR)

(72) Inventors: Dong Hun Lee, Suwon-si (KR); Sang Jin Lee, Suwon-si (KR); Min-Sek Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 29 days.

(21) Appl. No.: 16/580,153

(22) Filed: Sep. 24, 2019

(65) Prior Publication Data
US 2020/0135642 A1 Apr. 30, 2020

(30) Foreign Application Priority Data
Oct. 30, 2018 (KR) ........................ 10-2018-0130371

(51) Int. Cl.
*H01L 23/528* (2006.01)
*H01L 23/522* (2006.01)
(Continued)

(52) U.S. Cl.
CPC ...... *H01L 23/5283* (2013.01); *H01L 23/3128* (2013.01); *H01L 23/3171* (2013.01);
(Continued)

(58) Field of Classification Search
CPC ............. H01L 23/5283; H01L 23/5226; H01L 23/3128; H01L 23/3171; H01L 24/09; H01L 24/17; H01L 2224/0401; H01L 2224/02373; H01L 2224/02377; H01L 2224/02379; H01L 2224/02381; H01L 24/32; H01L 24/73; H01L 24/92; H01L 25/50; H01L 25/105; H01L 2924/3511; H01L 2225/1035; H01L 2225/1041;
(Continued)

(56) References Cited

U.S. PATENT DOCUMENTS 9,685,388 B2 6/2017 Tomita et al.
2014/0110856 A1* 4/2014 Lin .................. H01L 23/49827
257/774
(Continued)

FOREIGN PATENT DOCUMENTS

KR 10-1778433 B1 9/2017

*Primary Examiner* — Su C Kim
(74) *Attorney, Agent, or Firm* — Sughrue Mion, PLLC

(57) ABSTRACT

A semiconductor package includes a frame including wiring layers and having a recess portion in which a stopper layer is disposed on a bottom surface, a semiconductor chip having an active surface and an inactive surface, the inactive surface being disposed in the recess portion and facing the stopper layer, a first connection portion on the connection pad, a second connection portion on the uppermost wiring layer, a stiffener on the upper surface of the frame and surround at least a portion of the second connection portion, the stiffener being spaced apart from second connection portion, an encapsulant covering at least portions of each of the frame and the semiconductor chip, and filling at least a portion of the recess portion, and a connection structure on the frame and the semiconductor chip, and including a redistribution layer electrically connected to the first and second connection portions.

20 Claims, 18 Drawing Sheets

(51) Int. Cl.
*H01L 23/31* (2006.01)
*H01L 23/00* (2006.01)
(52) U.S. Cl.
CPC .......... *H01L 23/5226* (2013.01); *H01L 24/09* (2013.01); *H01L 24/17* (2013.01); *H01L 2224/02373* (2013.01); *H01L 2224/02377* (2013.01); *H01L 2224/02379* (2013.01); *H01L 2224/02381* (2013.01); *H01L 2224/0401* (2013.01)
(58) Field of Classification Search
CPC ... H01L 2924/3025; H01L 2224/04105; H01L 2924/15153; H01L 2224/73267; H01L 2224/32245; H01L 2224/92244; H01L 24/20; H01L 24/19; H01L 2221/68345; H01L 21/6835; H01L 21/56; H01L 24/02; H01L 24/14; H01L 23/3107; H01L 2224/02331; H01L 2224/141
See application file for complete search history.

(56) References Cited

U.S. PATENT DOCUMENTS

2016/0247763 A1* 8/2016 Chiu ................. H01L 24/23
2018/0166379 A1* 6/2018 Yeo .................. H01L 21/76879

\* cited by examiner

I-I'

I-I'

I-I'

SEMICONDUCTOR PACKAGE

CROSS-REFERENCE TO RELATED APPLICATION(S)

This application claims benefit of priority to Korean Patent Application No. 10-2018-0130371 filed on Oct. 30, 2018 in the Korean Intellectual Property Office, the disclosure of which is incorporated herein by reference in its entirety.

TECHNICAL FIELD

The present disclosure relates to a semiconductor chip, for example, to a fan-out semiconductor package capable of extending an electrical connection metal beyond a region in which a semiconductor chip is disposed.

BACKGROUND

Recently, a main trend in the development of technology related to semiconductor chips is to reduce the size of components. Therefore, in the package field, it is necessary to implement a large number of pins while having a compact size in accordance with a rapid increase in demand for small-sized semiconductor chips, and the like.

One type of semiconductor package technology suggested to satisfy the technical demand is a fan-out semiconductor package. Such a fan-out package has a compact size and may allow a plurality of pins to be implemented by redistributing electrical connection structures outwardly of a region in which a semiconductor chip is disposed.

SUMMARY

An aspect of the present disclosure is to provide a semiconductor package capable of securing reliability by controlling a thickness to be polished, when a semiconductor chip by introducing a frame having a blind recess portion is disposed, and a grinding process for an encapsulant is performed to expose a wiring of a frame and a connection pad of a semiconductor chip.

According to an aspect of the present disclosure, in a semiconductor package, a metal layer is disposed on an upper surface of a frame.

For example, a semiconductor package may include: a frame including a plurality of wiring layers electrically connected to each other, and having a recess portion in which a stopper layer is disposed on a bottom surface; a semiconductor chip having an active surface on which a connection pad is disposed and an inactive surface opposing the active surface, the inactive surface being disposed in the recess portion and facing the stopper layer; a first connection portion disposed on the connection pad; a second connection portion disposed on an uppermost wiring layer of the plurality of wiring layers; a stiffener disposed on an upper surface of the frame and surrounding at least a portion of the second connection portion, the stiffener being spaced apart from the second connection portion; an encapsulant covering at least a portion of each of the frame, the semiconductor chip, the first connection portion, the second connection portion, and the stiffener, and filling at least a portion of the recess portion; and a connection structure disposed on the frame and the active surface of the semiconductor chip, and including a redistribution layer electrically connected to the first and second connection portions.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, embodiments of the present disclosure will be described as follows with reference to the attached drawings.

Electronic Device

Figure 1:
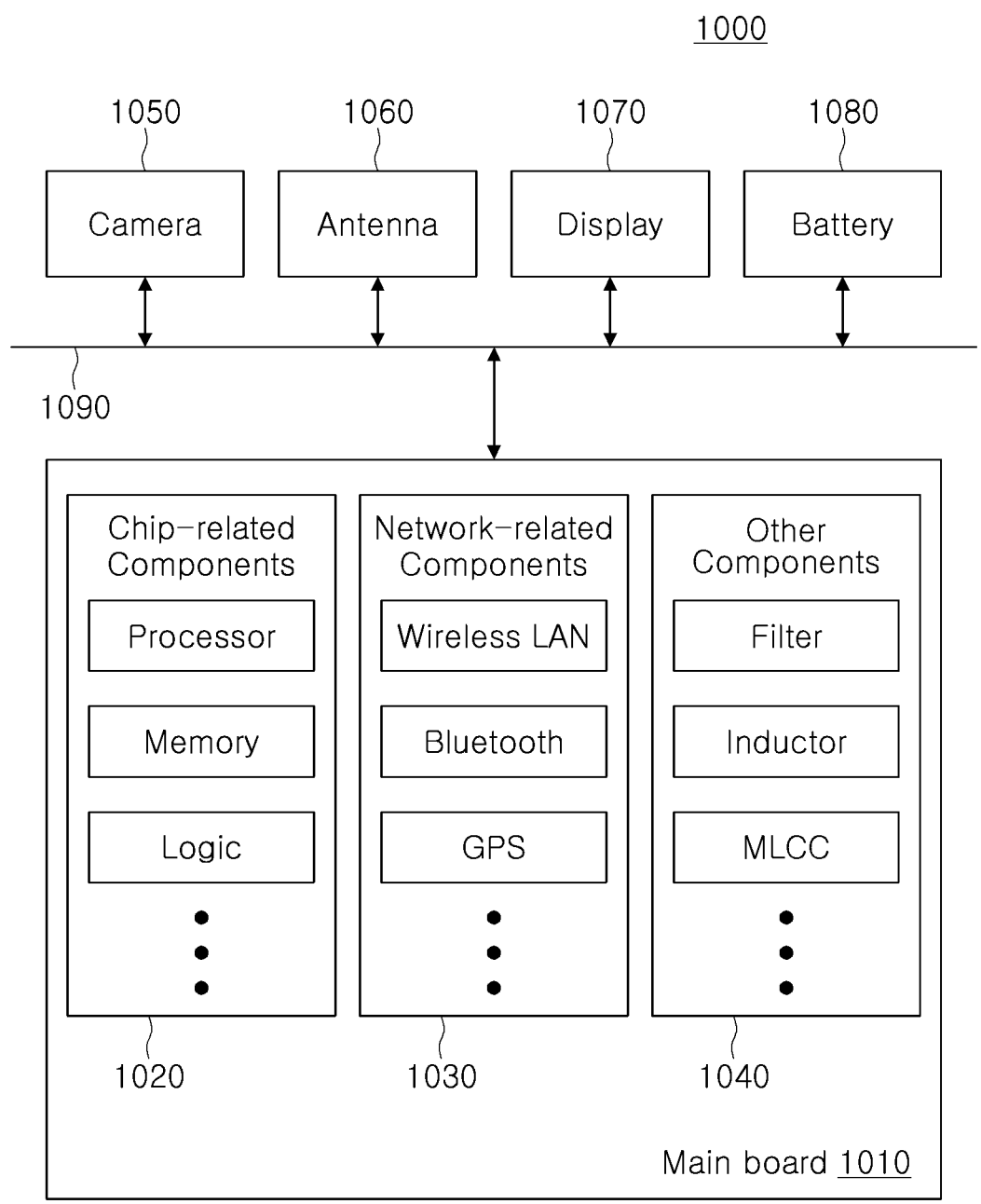
FIG. 1 is a schematic block diagram illustrating an example of an electronic device system.

FIG. 1 is a schematic block diagram illustrating an example of an electronic device system.

Referring to FIG. 1, an electronic device 1000 may receive a motherboard 1010. The mother board 1010 may include chip related components 1020, network related components 1030, other components 1040, or the like, physically or electrically connected thereto. These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, but may also include a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
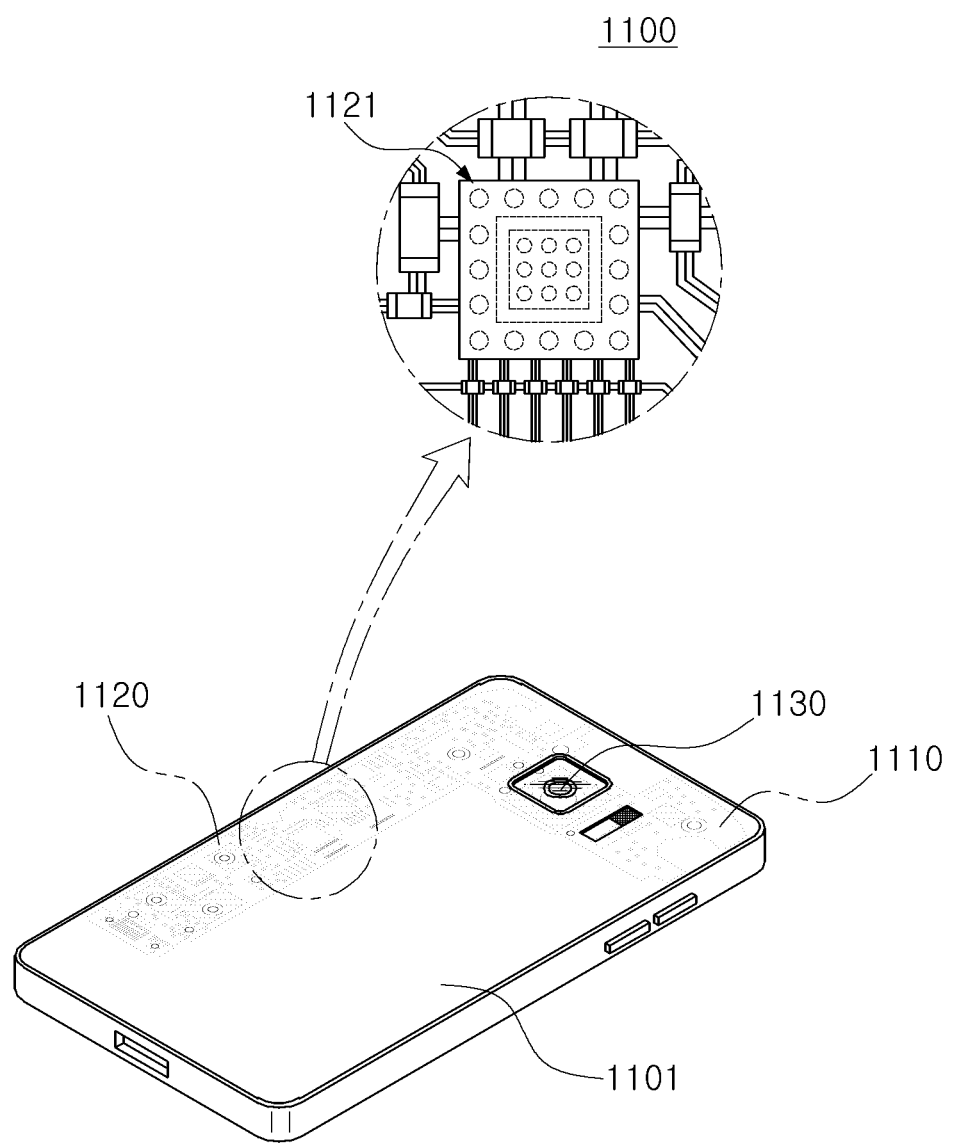
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
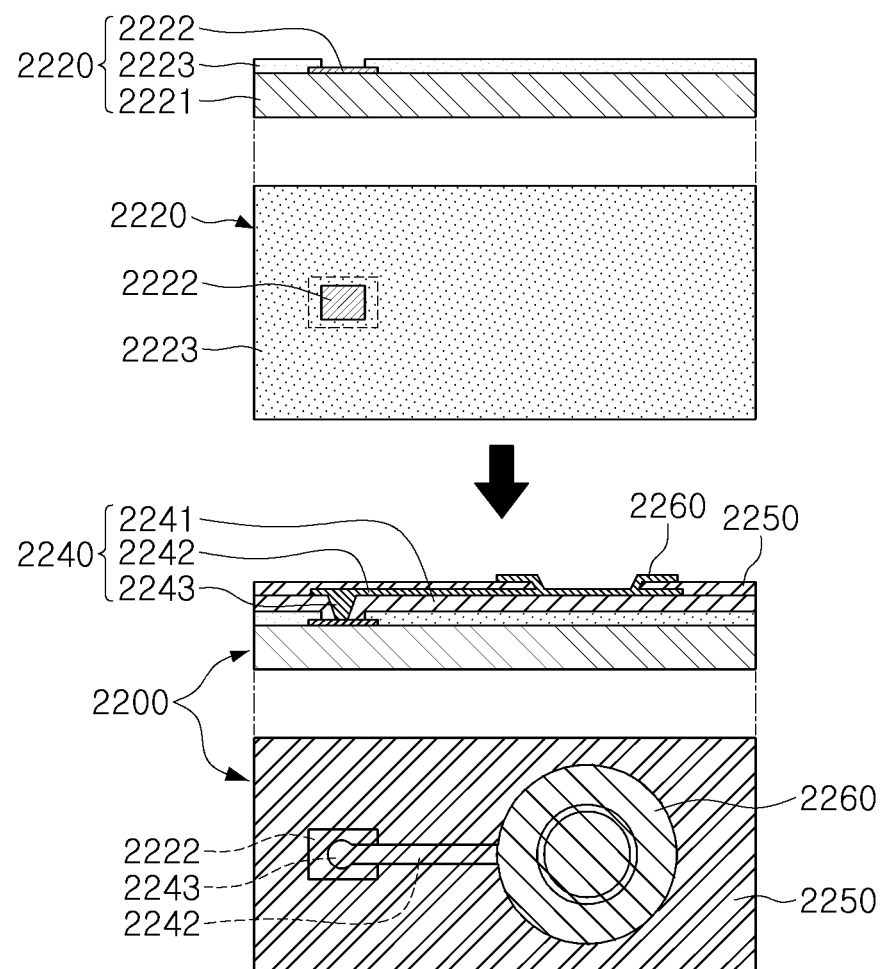
FIGS. 3A and 3B are schematic cross-sectional views illustrating states of a fan-in semiconductor package before and after being packaged.
Figure 3B:
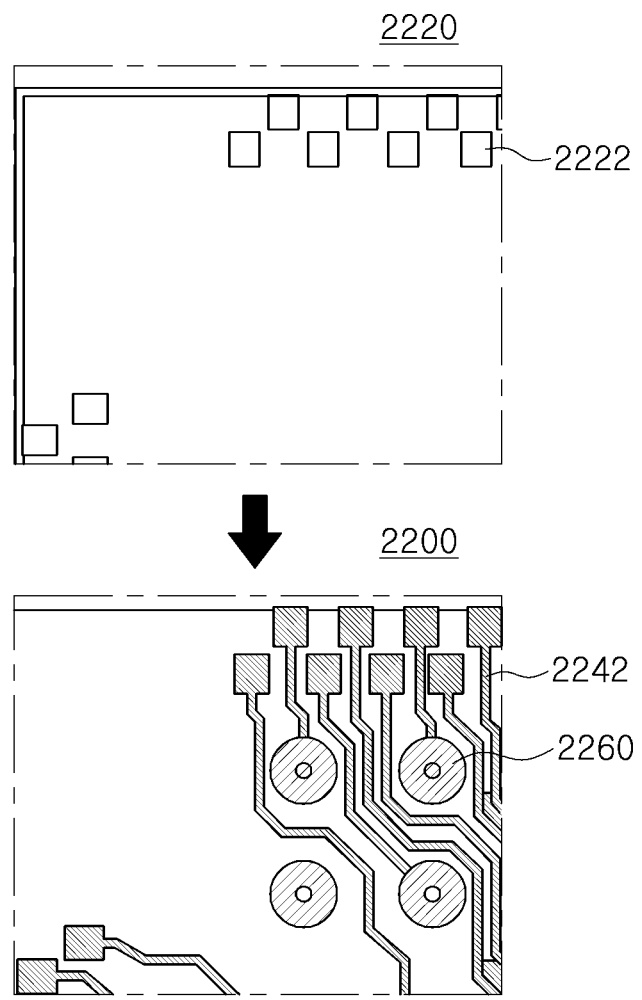

FIGS. 3A and 3B are schematic cross-sectional views illustrating states of a fan-in semiconductor package before and after being packaged.

Figure 4:
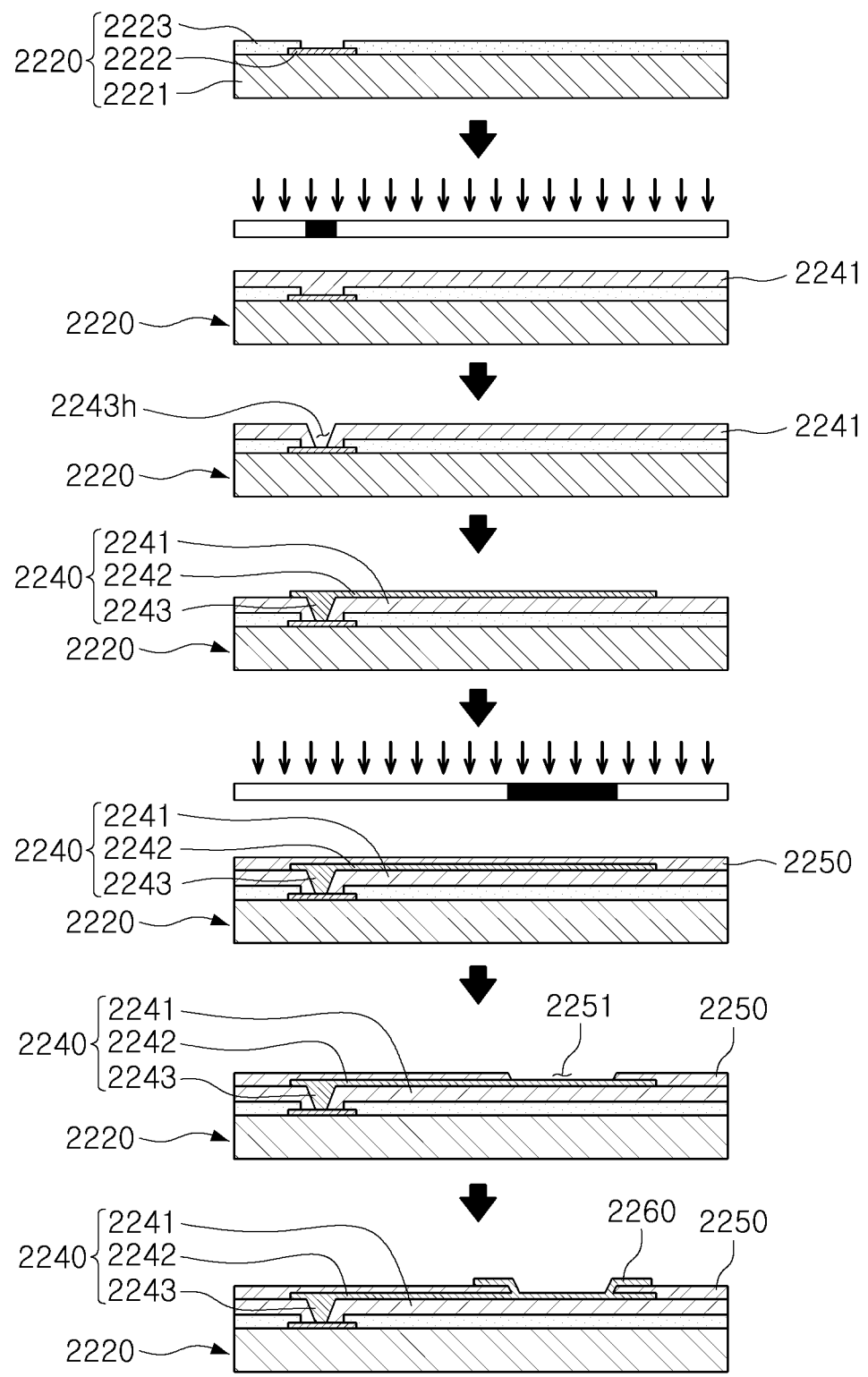
FIG. 4 is a schematic cross-sectional view illustrating a packaging process of a fan-in semiconductor package.

FIG. 4 is a schematic cross-sectional view illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. Here, even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
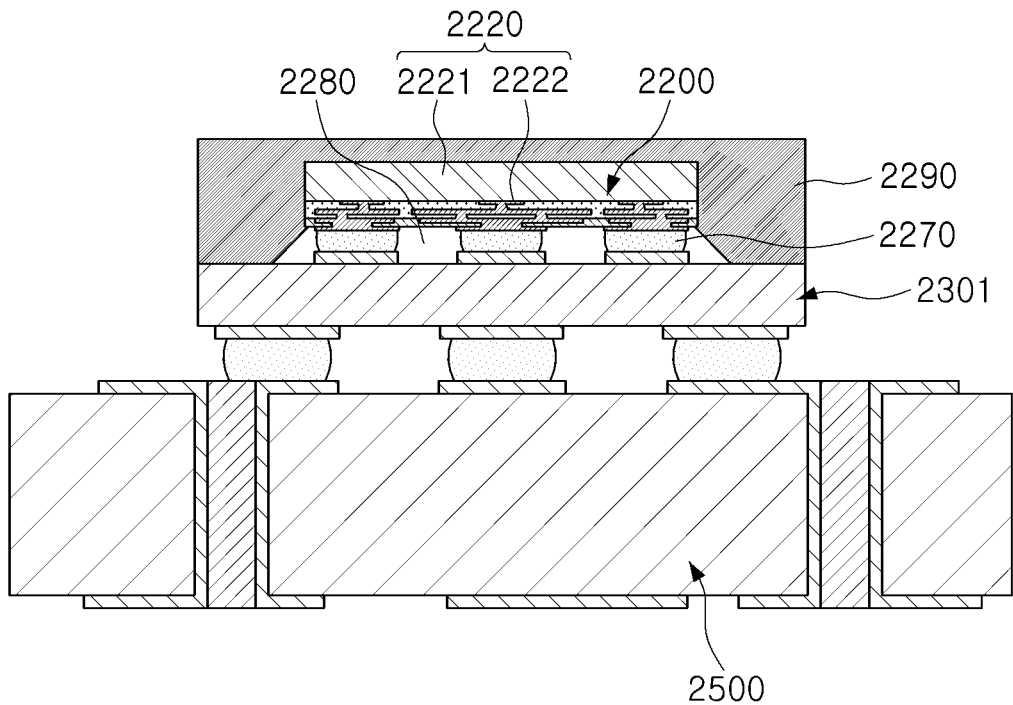
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
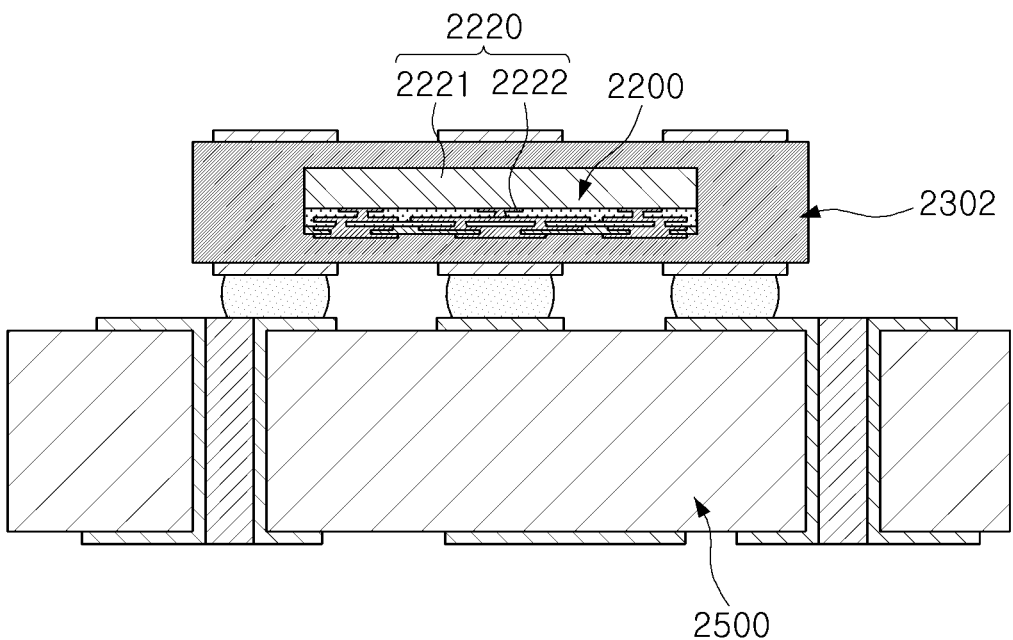
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may ultimately be mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
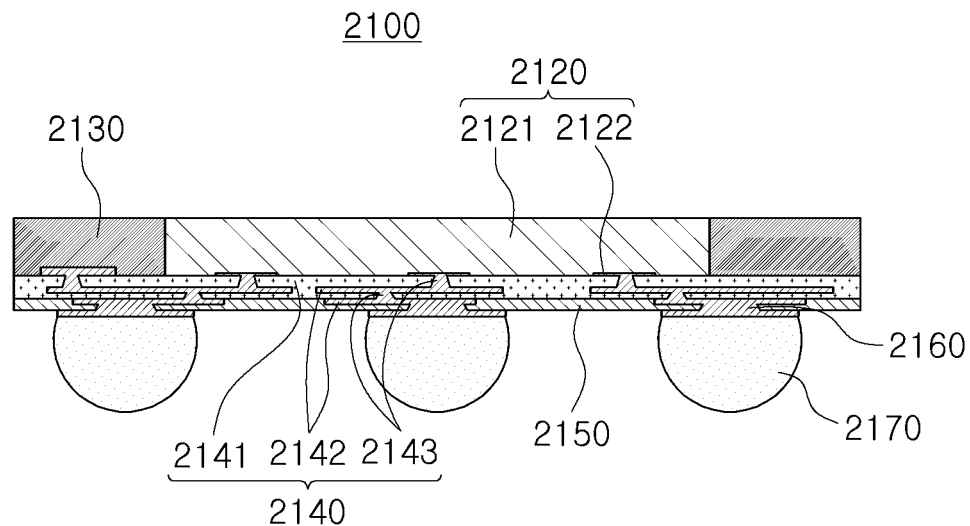
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2202 may further be formed on the connection structure 2140, and an underbump metal layer 2160 may further be formed in openings of the passivation layer 2202. Solder balls 2170 may further be formed on the underbump metal layer 2160. The semiconductor chip 2120 may be an integrated circuit (IC) including a body 2121, the connection pads 2122, a passivation layer (not illustrated), and the like. The connection structure 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
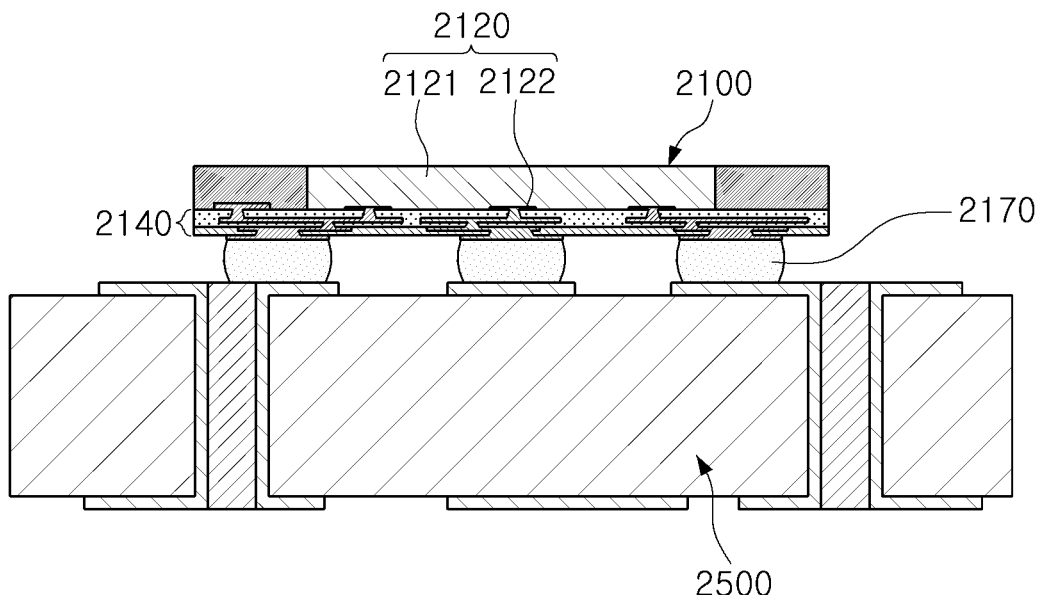
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Hereinafter, a semiconductor package, in which adhesion between a metal layer and an encapsulant is improved in an upper portion of a semiconductor chip, and which can be manufactured by a simplified process, will be described with reference to the drawings.

Figure 9:
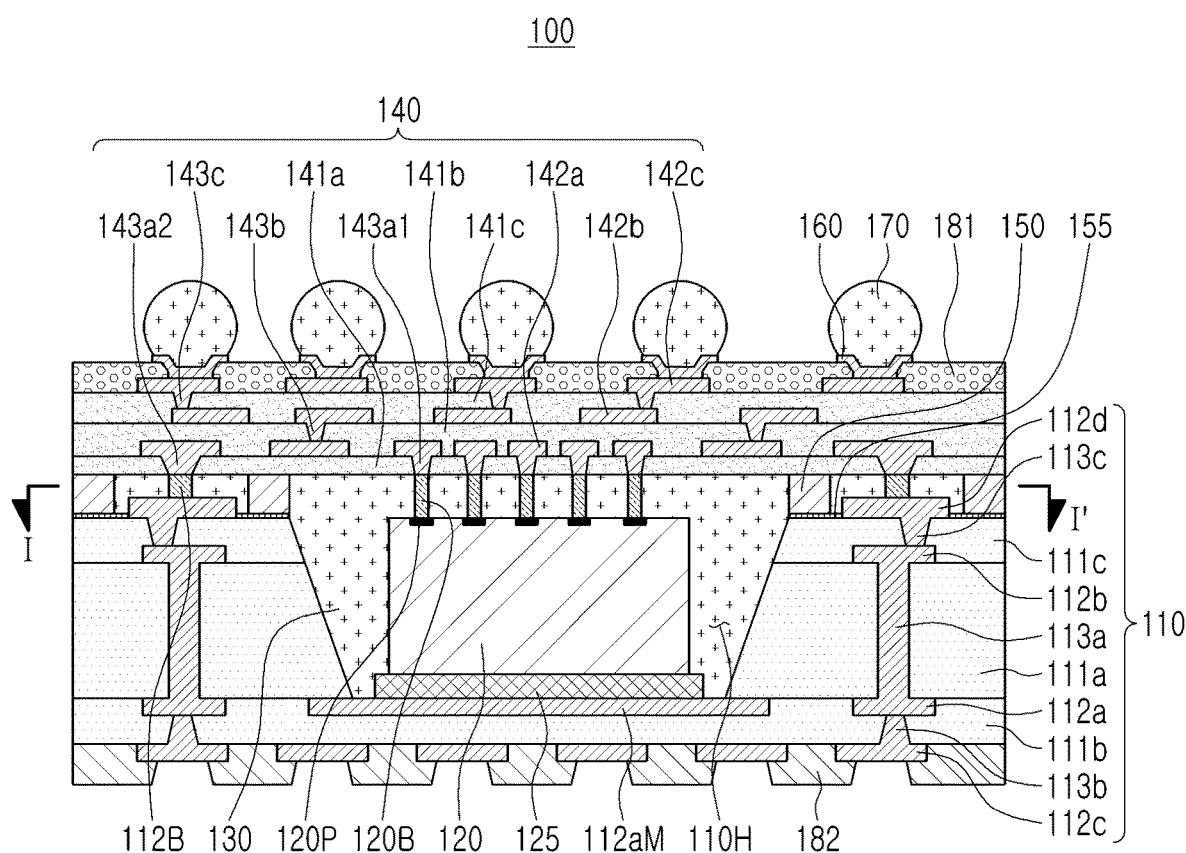
FIG. 9 is a schematic cross-sectional view illustrating an example of a semiconductor package.

FIG. 9 is a schematic cross-sectional view illustrating an example of a semiconductor package.

Figure 10:
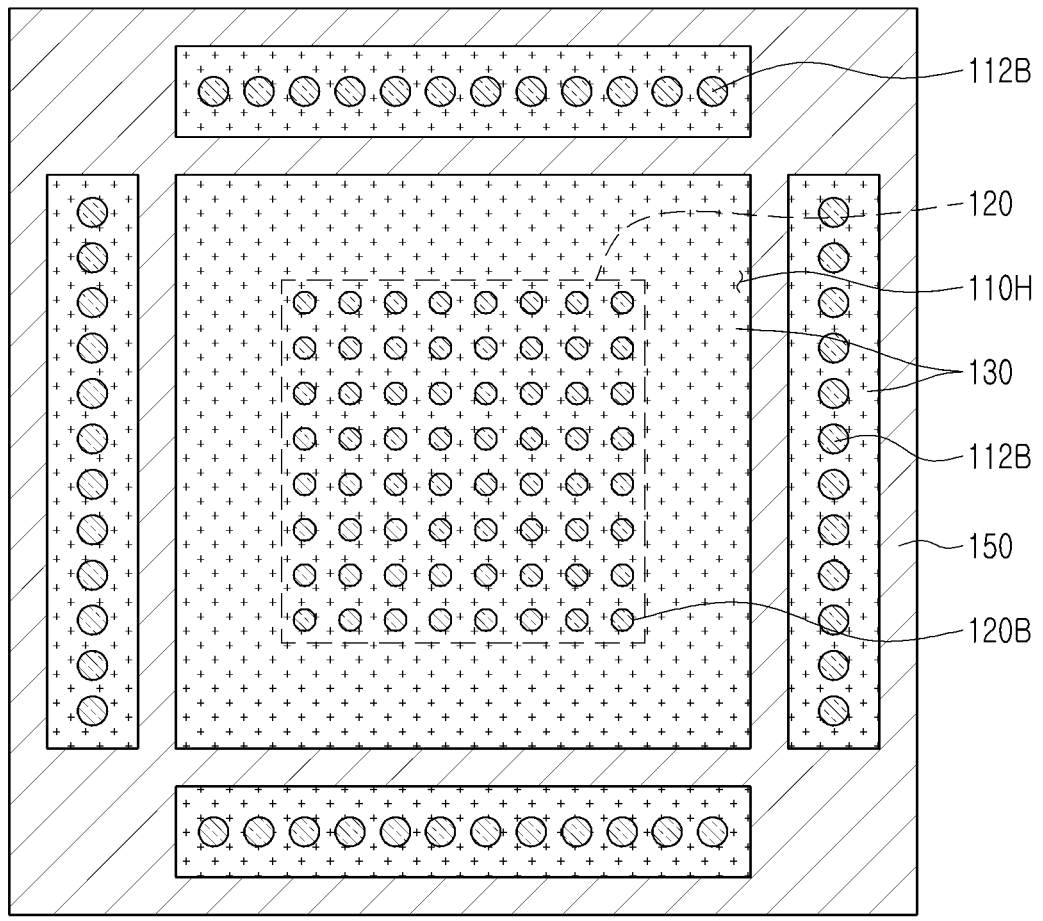
FIG. 10 is a schematic plan view taken along line I-I' of the semiconductor package of FIG. 9.

FIG. 10 is a schematic plan view taken along line I-I' of the semiconductor package of FIG. 9.

Referring to FIGS. 9 and 10, a semiconductor package 100 according to an embodiment may include a frame 110 including a plurality of insulating layers 111a, 111b, and 111c, a plurality of wiring layers 112a, 112b, 112c, and 112d, and a plurality of connection via layers 113a, 113b, and 113c, and having a recess portion 110H in which a stopper layer 112aM is disposed on a bottom layer; a semiconductor chip 120 having an active surface on which a connection pad 120P is disposed and an inactive surface opposing the active surface, the inactive surface being disposed in the recess portion 110H so as to face the stopper layer 112aM; a first connection portion 120B disposed on the connection pad 120P; a second connection portion 112B disposed on the uppermost wiring layer 112d of the frame 110; a stiffener 150 disposed on an upper surface of the frame 110 so as to surround at least a portion of the second connection portion 112B, the stiffener 150 being spaced apart from the second connection portion 112B; an encapsulant 130 covering at least portions of each of the frame 110, the semiconductor chip 120, and the first connection portion 120B, and the second connection portion 112B, and filling at least a portion of the recess portion 110H; and a connection structure 140 disposed on the frame 110 and the active surface of the semiconductor chip 120, and including redistribution layers 142a, 142b, and 142c electrically connected to the first and second connection portions 120B and 112B.

Meanwhile, it is necessary to previously form a metal post, or the like, on the connection pad of the semiconductor chip, in order to introduce a frame having a blind recess portion, to dispose and encapsulate a semiconductor chip on the recess portion, and then to form a connection portion thereon, and in this case, a grinding process may be required to make a flat surface for forming a connection structure including a redistribution layer. This is because it is necessary to make a height of the metal post constant, without a step. However, it is required to confirm a remaining thickness of the metal post during a grinding processing, and expensive measuring equipment may be required therefor. In addition, even when the expensive measuring equipment is used, when a setting is wrong, defects such as surface exposure and surface damage of the semiconductor chip or the frame may occur due to over-grinding.

On the other hand, a semiconductor package 100 according to an example may include connection portions 120B and 112B such as a metal post, or the like, and a stiffener 150 having an upper surface which is located at the same height as upper surfaces the connection portions 120B and 112B and substantially coplanar with each other. The stiffener 150 may be spaced apart by a predetermined distance from the connection portions 120B and 112B and be disposed to surround the connection portions 120B and 110B as illustrated in FIG. 10. The stiffener 150 may have a single plate shape having an opening at a position corresponding to the recess portion 110H and the second connection portion 112B. The stiffener 150 may include a material different from the connection portions 120B and 112B, and for example, may be made of a material having a hardness greater than that of the connection portions 120B and 112B. For example, the connection portions 120B and 112B may be made of copper (Cu), and the stiffener 150 may be made of stainless steel such as iron (Fe), and especially, stainless steel (SUS). In this case, when the stiffener 150 is exposed during the grinding process, an overcurrent may be generated, such that polishing may not proceed continuously, whereby an entire polishing amount may be controlled. That is, the stiffener 150 may function as a barrier or a stopper in the grinding process, such that the polishing thickness during grinding may be controlled even when the remaining thickness of the connection portions 120B and 112B is not measured by a separate equipment. In addition, since the stiffener 150 is disposed on substantially an entire upper surface of an uppermost insulating layer 111c of the frame 110 not including regions for forming the uppermost wiring layer 112d in a form of a plate surrounding the second connection portion 112B, heat dissipation characteristic of the semiconductor package 100 may be improved by the stiffener 150, and warpage may be enhanced. For example, the stiffener 150 may extend from edges of the uppermost insulating layer 111c toward the uppermost wiring layer 112d and have a predetermined distance from the uppermost wiring layer 112d to ensure electrical isolation.

Hereinafter, each configuration included in the semiconductor package 100 according to an example will be described in more detail.

The frame 110 may further improve the rigidity of the semiconductor package 100 according to a specific material, and may play a role of ensuring the thickness uniformity of the encapsulant 130. In addition, since the frame 110 includes wiring layers 112a, 112b, 112c, and 112d and connection vias 113a, 113b, and 113c, the frame 110 may also serve as a vertical electrical connection member. In addition, since the frame 110 includes a third wiring layer 113c disposed in a lower side than the inactive surface of the semiconductor chip 120, a backside wiring layer for the semiconductor chip 120 may be provided without a forming process of a separate backside wiring layer. That is, at least one of the wiring layers 112a, 112b, 112c, and 112d may be disposed in a lower side than a stopper layer 112aM.

The frame 110 may have a blind recess portion 110H formed by using the stopper layer 112aM as a stopper, and the inactive surface of the semiconductor chip 120 may be attached to the stopper layer 112aM via a known adhesive member 125, or the like, such as a die attach film (DAF). The recess portion 110H may be formed through a sandblasting process as described later, and in this case, a cross-sectional shape thereof may have a tapered shape. That is, a wall surface of the recess portion 110H may have a predetermined slop with respect to the stopper layer 112aM. In this case, an alignment process of the semiconductor chip 120 may be more easily performed, such that yield may be increased.

The frame 110 may include a core insulating layer 111a, a first wiring layer 112a and a second wiring layer 112b disposed on a lower surface and an upper surface of the core insulating layer 111a, respectively, a first build-up insulating layer 111b disposed in a lower side of the core insulating layer 111a to cover the first wiring layer 112a, a third wiring layer 112c disposed on the first build-up insulating layer 111b, a second build-up insulating layer 111c disposed in an upper side of the core insulating layer 111a to cover the second wiring layer 112b, and a fourth wiring layer 112d disposed on the second build-up insulating layer 111c. In addition, the frame 110 may include a first connection via layer 113a penetrating the core insulating layer 111a and electrically connecting the first and second wiring layers 112a and 112b, a second connection via layer 113b penetrating the first build-up insulating layer 111b and electrically connecting the first and third wiring layers 112a and 112c, and a third connection via layer 113c penetrating the second build-up insulating layer 111c and electrically connecting the second and fourth wiring layers 112b and 112d.

The first to fourth wiring layers 112a, 112b, 112c, and 112d of the frame 110 may be electrically connected to each other, and may be electrically connected to the connection pad 120P of the semiconductor chip 120, respectively. The recess portion 110H may penetrate the core insulating layer 111a and the second build-up insulating layer 111c, but may not penetrate the first build-up insulating layer 111b. The stopper layer 112aM may be disposed on a lower surface of the core insulating layer 111a, and may be covered with the first build-up insulating layer 111b. The first build-up insulating layer 111b and the second build-up insulating layer 111c, and wiring layers 112c and 112d and connection via layers 113b and 113c, which are formed therein may be formed in a larger number than those illustrated in the drawings. They may have a substantially symmetrical shape with respect to the core insulating layer 111a.

The stopper layer 112aM may be a metal layer including a metal such as copper (Cu), or the like. Alternatively, it may include a material having a lower etching rate for the sandblasting than metal. For example, a dry film photoresist may be used. When the stopper layer 112aM is a metal layer, the stopper layer 112aM itself may be used as a ground, and in this case, the stopper layer 112aM may be electrically connected to a ground of at least one wiring layer of the wiring layers 112a, 112b, 112c, and 112d. The lower surface of the stopper layer 112aM may be covered with the first build-up insulating layer 111b, and at least a portion of the upper surface thereof may be exposed by the recess portion 110H. In the stopper layer 112aM, a thickness of a region exposed from the core insulating layer 111a by the recess portion 110H may be thinner than a thickness of an edge region which is not exposed from the core insulating layer 111a by the recess portion 110H. This is because the exposed region may also be partially removed.

An insulating material may be used as the material of each of the insulating layers 111a, 111b, and 111c, the insulating material may be a thermosetting resin such as an epoxy resin, a thermoplastic resin such as a polyimide resin, an insulating material in which the thermosetting resin or the thermoplastic resin is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. When a material having a high rigidity such a prepreg including a glass fiber, or the like, is used, the frame 110 may be utilized as a supporting member for controlling warpage of the package 100.

The core insulating layer 111a may be thicker than the first build-up insulating layer 111b and the second build-up insulating layer 111c. The core insulating layer 111a may be relatively thick to basically maintain rigidity, and the first build-up insulating layer 111b and the second build-up insulating layer 111 may be introduced to form a larger number of wiring layers 112c and 112d. The core insulating layer 111a may include an insulating material different from the first build-up insulating layer 111b and the second build-up insulating layer 111c. For example, the core insulating layer 111a may be introduced through a relatively thick copper-clad laminate (CCL) plate, and the first build-up insulating layer 111b and the second build-up insulating layer 111c may be introduced through a prepreg, an ABF, or the like, which is relatively thin, but is not limited thereto. Similarly, the first connection via layer 113a penetrating the core insulating layer 111a may have a diameter greater than those of the second and third connection via layers 113b and 113c penetrating the first and second build-up insulating layers 111b and 111c.

Each of the wiring layers 112a, 112b, 112c, and 112d may redistribute the connection pad 120P of the semiconductor chip 120 together with the redistribution layers 142a, 142b, and 142c. A material of each of the wiring layers 112a, 112b, 112c, and 112d may be a metal material such as copper (Cu), aluminum (Al), silver (Ag), tin (Sn), gold (Au), nickel (Ni), lead (Pb), titanium (Ti), or alloys thereof. The wiring layers 112a, 112b, 112c, and 112d may perform various functions according to a design of the corresponding layer. For example, the wiring layers may include a ground (GrouND: GND) pattern, a power (PoWeR: PWR) pattern, a signal (Signal: S), and the like. Here, the signal (S) pattern may include various signals except for the ground (GND) pattern, the power (PWR) pattern, and the like, such as data signals, and the like. In addition, various pad patterns may be included.

Thicknesses of each of the wiring layers 112a, 112b, 112c, and 112d may be thicker than thicknesses of each of the redistribution layers 142a, 142b, and 142c of the connection structure 140. Since the frame 110 may have a thickness greater than the semiconductor chip 120, the wiring layers 112a, 112b, 112c, and 112d may also be formed to have a relatively large size. On the other hand, the redistribution layers 142a, 142b, and 142c may be formed in a relatively smaller size for thinning.

Each of the connection via layers 113a, 113b, and 113c may electrically connect the wiring layers 112a, 112b, 112c, and 112d, formed on different layers to each other, resulting in an electrical path in the frame 110. A formation material of each of the connection via layers 113a, 113b, and 113c may also be a metal material. The connection via layers 113a, 113b, and 113c may be completely filled with the metal material, or the metal material may be formed along a wall surface of a via hole. The first connection via layer 113a may have a cylindrical cross-sectional shape or an hourglass cross-sectional shape, and the second and third connection via layers 113b and 113c may have a tapered cross-sectional shape. In this case, the second and third connection via layers 113b and 113c may have a tapered cross-sectional shape in an opposite direction with respect to the core insulating layer 111a.

The semiconductor chip 120 may be an integrated circuit (IC) in which several hundreds to several millions of elements are integrated in a single chip. The semiconductor chip 120 may be a processor chip such as a central processing unit (CPU), a graphics processing unit (GPU), a field programmable gate array (FPGA), a digital signal processor, a cryptographic processor, a microprocessor, a microcontroller, or the like, or more specifically, an application processor (AP). However, the semiconductor chip 120 is not limited thereto. The semiconductor chip 120 may be a logic chip such as an analog-digital converter or an application-specific IC (ASIC) or a memory chip such as a volatile memory (for example, DRAM) or non-volatile memory (for example, ROM and flash memory) but is not limited thereto. These may be combined with each other as well.

The semiconductor chip 120 may be formed on the basis of an active wafer. In this case, a base material of a body of the semiconductor chip 120 may be silicon (Si), germanium (Ge), gallium arsenide (GaAs), or the like. Various circuits may be formed on the body. The connection pads 120P may electrically connect the semiconductor chip 120 to other components. A material of each of the connection pads 122 may be a metal material such as aluminum (Al), copper (Cu), or the like without particular limitation. Although not illustrated, a passivation film such as an oxide film or a nitride film exposing the connection pad 120P may be formed on the active surface of the body, and the passivation film may be a double layer of an oxide film and a nitride film. The passivation film may have an opening exposing at least a portion of the connection pad 120P. An insulating film, or the like may be further disposed at a necessary position. The semiconductor chip 120 may be a bare die or a packaged die in which an insulating layer, a redistribution layer, a bump, or the like are formed on the active surface.

The first connection portion 120B may be introduced to electrically connect the connection pad 120P of the semiconductor chip 120 to the redistribution layers 142a, 142b, and 142c of the connection structure 140. The first connection portion 120B may be a metal post or a metal pillar, such as a copper post or a copper pillar, but is not limited thereto. The first connection portion 120B may have a substantially vertical side surface. The number of the first connection portion 120B is not particularly limited, and may be variously applied depending on the number of the connection pad 120P. The first connection portion 120B may be connected to the first redistribution layer 142a through a first-first via 143a1 of the connection structure 140.

The second connection portion 112B may be introduced to electrically connect the uppermost wiring layer 112d of the frame 110 to the wiring layers 142a, 142b, and 142c of the connection structure 140. The second connection portion 112B may also be a metal post, for example, a copper post, but is not limited thereto. The second connection portion 112B may also have a substantially vertical side surface. The number of the second connection portion 112B is not particularly limited, and may be variously applied according to a design of a pattern of the uppermost wiring layer 112d. The second connection portion 112B may be connected to the first redistribution layer 142a through a first-second via 143a2 of the connection structure 140.

The stiffener 150 may be spaced apart by a predetermined distance from the second connection portion 112B on the uppermost surface of the frame 110 and may be disposed to surround the second connection portion 112B. As illustrated in FIG. 10, the stiffener 150 may be disposed on an outer side of the recess portion 110H of the frame 110 on the plane, and may be disposed to surround the second connection portion 112B of four groups on outer sides of four surfaces. The stiffener 150 may be adhered to the frame 110 by an adhesive layer 155. The adhesive layer 155 may be disposed in a region in which the uppermost wiring layer 112d is not disposed on the upper surface of the frame 110, and may be disposed extending in a horizontal direction than the stiffener 150. That is, the adhesive layer 155 may be disposed on the second build-up insulating layer 111c of the frame 110 even in a region in which the stiffener 150 is not disposed, but is not limited thereto. According to embodiments, the adhesive layer 155 may be disposed only between the stiffener 150 and the second build-up insulating layer 111c.

The upper surface of the stiffener 150 may be located at the same height level as upper surfaces of the first and second connection portions 120B and 112B. That is, heights of the first and second connection portions 120B and 112B may be determined by the height of the stiffener 150 during the manufacturing process. The stiffener 150 may be formed of a metal material such as copper (Cu), aluminum (Al), silver (Ag), tin (Sn), gold (Au), nickel (Ni), lead (Pb), titanium (Ti), or alloys thereof. In particular, the stiffener 150 may be made of a material having a hardness higher than that of the first and second connection portions 120B and 112B, and may be made of, for example, stainless steel, but is not limited thereto. The stiffener 150 may be electrically insulated from the first and second connection portions 120B and 112B by the encapsulant 130 and the adhesive layer 155. The stiffener 150 is not necessarily made of a metal material, and when the stiffener 150 is made of an insulating material, the stiffener 150 may be disposed so as to be partially in contact with the uppermost wiring layer 112d.

The encapsulant 130 may cover at least portions of each of the frame 110, the semiconductor chip 120, and the first and second connection portions 120B and 112B, and fill at least a portion of the recess portion 110H. In addition, the encapsulant 130 may fill a space between the second connection portion 112B, the adhesive layer 155, the stiffener 150, and the uppermost wiring layer 112d, at a periphery of the second connection portion 112B. That is, the encapsulant 130 may fill a space between the stiffener 150 and the wiring layer 112d and a space between the stiffener 150 and the second connection portion 112B. A material of the encapsulant 130 is not particularly limited. For example, an insulating material may be used, and in this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. If necessary, a photo imagable encapsulant (PIE) resin may be used.

The encapsulant 130 may be embedded such that the upper surfaces of the first and second connection portions 120B and 112B and the stiffener 150 are exposed from the upper surface of the encapsulant 130. In this case, the upper surfaces of each of the first and second connection portions 120B and 112B and the stiffener 150 may be substantially flush with the upper surface of the encapsulant 130. That is, they may coplanar with each other. This is because, as can be seen from the process described later, they are simultaneously grinding processed.

The connection structure 140 may redistribute the connection pad 120P of the semiconductor chip 120, and may be electrically connect the wiring layers 112a, 112b, 112c, and 112d of the frame 110 to the connection pad 120P of the semiconductor chip 120. Several tens to several hundreds of connection pads 120P having various functions may be redistributed by the connection structure 140, and may be physically and/or electrically externally connected through the electrical connection metal 170 depending on functions.

The connection structure 140 may include a first insulating layer 141a disposed on the frame 110, the encapsulant 130, and the active surface of the semiconductor chip 120, a first redistribution layer 142a disposed on the first insulating layer 141a, first vias 143a1 and 143a2 penetrating the first insulating layer 141a and electrically connecting the first redistribution layer 142a to the connection portions 120B and 112B, a second insulating layer 141b disposed on the first insulating layer 141a to cover the first redistribution layer 142a, a second redistribution layer 142b disposed on the second insulating layer 141b, a second via 143b penetrating the second insulating layer 141b and electrically connecting the first and second redistribution layers 142a and 142b, a third insulating layer 141c disposed on the second insulating layer 141b to cover the second redistribution layer 142b, a third redistribution layer 142c disposed on the third insulating layer 141c, and a third via 143c penetrating the third insulating layer 141c and electrically connecting the second and third redistribution layers 142b and 142c. The insulating layers, the redistribution layers, and the via layers of the connection structure 140 may be composed of a larger number of layers or a smaller number of layers.

A material each of the insulating layers 141a, 141b, and 141c may be an insulating material. In this case, a photosensitive insulating material such as a PID resin may also be used as the insulating material, in addition to the insulating material as described above. That is, each of the insulating layers 141a, 141b, and 141c may be a photosensitive insulating layer. When the insulating layers 141a, 141b, and 141c have photosensitive properties, the insulating layers 141a, 141b, and 141c may be formed to have a smaller thickness, and a fine pitch of each of vias 143a, 143b, and 143c may be achieved more easily. Each of the insulating layers 141a, 141b, and 141c may be a photosensitive insulating layer including an insulating resin and an inorganic filler. When the insulating layers 141a, 141b, and 141c are multiple layers, materials of the insulating layers 141a, 141b, and 141c may be the same as each other, and may also be different from each other, if necessary. When the insulating layers 141a, 141b, and 141c are multiple layers, the insulating layers 141a, 141b, and 141c may be integrated with each other depending on processes, so that a boundary therebetween may not be readily apparent.

The redistribution layers 142a, 142b, and 142c may substantially serve to redistribute the connection pad 120P, and a formation material thereof may be a metal material such as copper (Cu), aluminum (Al), silver (Ag), tin (Sn), gold (Au), nickel (Ni), lead (Pb), titanium (Ti), or alloys thereof. The redistribution layers 142a, 142b, and 142c may perform various functions depending on designs of corresponding layers. For example, the redistribution layers 142a, 142b, and 142c may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. Moreover, the redistribution layers 142a, 142b, and 142c may include various pad patterns.

The vias 143a1, 143a2, 143b, and 143c may electrically connect the redistribution layers 142a, 142b, and 142c, the connection portions 120B and 112B, and the like, formed on different layers, from each other, resulting in an electrical path in the semiconductor package 100. The vias 143a1, 143a2, 143b, and 143c may function as a signal via, a ground via, a power via, and the like. A material of each of the vias 143a1, 143a2, 143b, and 143c may be a metal material such as copper (Cu), aluminum (Al), silver (Ag), tin (Sn), gold (Au), nickel (Ni), lead (Pb), titanium (Ti), or alloys thereof. The vias 143a1, 143a2, 143b, and 143c may be a field type filled with a metal material, or a conformal type in which a metal material is formed along a wall of a via hole. In addition, the vias 143a1, 143a2, 143b, and 143c may have a tapered cross-sectional shape, or the like. A height of the first-first via 143a1 may be substantially the same as a height of the first-second via 143a2.

The first passivation layer 181 may protect the connection structure 140 from external physical or chemical damages, with an additional configuration. The first passivation layer 181 may have an opening exposing at least a portion of the uppermost redistribution layer 142c of the connection structure 140. The number of openings, formed in the first passivation layer 181, may be several tens to several millions. A material of the first passivation layer 181 is not particularly limited. For example, an insulating material may be used. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Alternately, other well-known solder resist may be used.

A second passivation layer 182 may protect the frame 110 from external physical chemical damage, or the like, with an additional configuration. The second passivation layer 182 may have an opening exposing at least a portion of the lowermost wiring layer 112c of the frame 110. The number of openings, formed in the second passivation layer 182, may be several tens to several millions. A material of the second passivation layer 182 is not particularly limited. For example, an insulating material may be used. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Alternately, other well-known solder resist may be used.

The underbump metal layer 160 may improve connection reliability of the electrical connection metal 170 to improve board level reliability of the semiconductor package 100. The underbump metal layer 160 may be connected to the uppermost redistribution layer 142*c* of the connection structure 140, exposed through the opening of the first passivation layer 181. The underbump metal layer 160 may be formed in the opening of the first passivation layer 181 by any known metallization method using any known metal material such as a metal, but is not limited thereto.

The electrical connection metal 170 physically and/or electrically connects the semiconductor package 100 to an external power source. For example, the semiconductor package 100 may be mounted on the mainboard of the electronic device through the electrical connection metal 170. The electrical connection metal 170 may be formed of a low melting point metal, for example, a material including tin (Sn), more specifically, a solder, or the like. However, this is only an example, and a material of each of the electrical connection metal is not particularly limited thereto. The electrical connection metal 170 may be a land, a ball, a pin, or the like. The electrical connection metal 170 may be formed of multiple layers or a single layer. When the electrical connection metal includes the plurality of layers, the electrical connection metal includes a copper pillar and a solder. When the electrical connection metal includes the single layer, the electrical connection metal includes a tin-silver solder or copper. However, the electrical connection metal is only an example, and the present disclosure is not limited thereto.

The number, an interval, a disposition form, and the like, of the electrical connection metals 170 are not particularly limited, but may be sufficiently modified depending on design particulars by those skilled in the art. For example, the electrical connection metals 170 may be provided in an amount of several tens to several thousands, or may be provided in an amount of several tens to several thousands or more or several tens to several thousands or less depending on the number of the connection pads 120P. When the electrical connection metal 170 is a solder ball, the electrical connection metal 170 may cover a side surface formed to be extended on one surface of the first passivation layer 181 of the underbump metal layer 180, and the connection reliability may be further improved.

At least one of the electrical connection metal 170 may be disposed in a fan-out region. The fan-out region refers to a region except for a region in which the semiconductor chip 120 is disposed. The fan-out package may have excellent reliability as compared to a fan-in package, may allow a plurality of input/output (I/O) terminals to be implemented, and may facilitate a 3D interconnection. In addition, as compared to a ball grid array (BGA) package, a land grid array (LGA) package, or the like, the fan-out package may be manufactured to have a small thickness, and may have price competitiveness.

Although not illustrated in the drawings, a metal thin film may be formed on the wall surface of the recess portion 110H for heat dissipation and/or electromagnetic wave shielding, if necessary. In addition, if necessary, a plurality of semiconductor chips 120 performing the same or different functions in the recess portion 110H may be disposed. In addition, if necessary, separate passive component, such as an inductor, a capacitor, or the like may be disposed in the recess portion 110H. In addition, if necessary, surface mounting (SMT) components including a passive component, such as an inductor, a capacitor, or the like may be disposed on the surfaces of the first and second passivation layers 181 and 182.

Figure 11A:
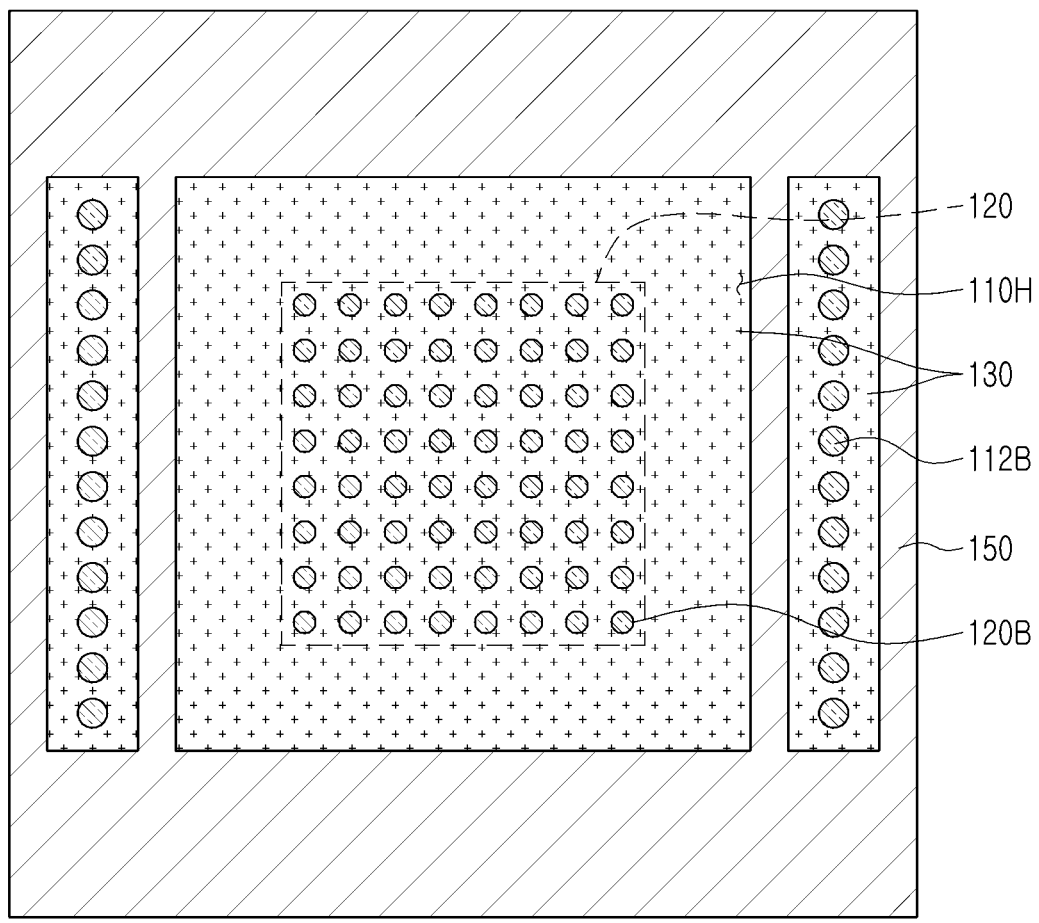
FIGS. 11A to 11B are schematic plan views illustrating another example of a semiconductor package.
Figure 11B:
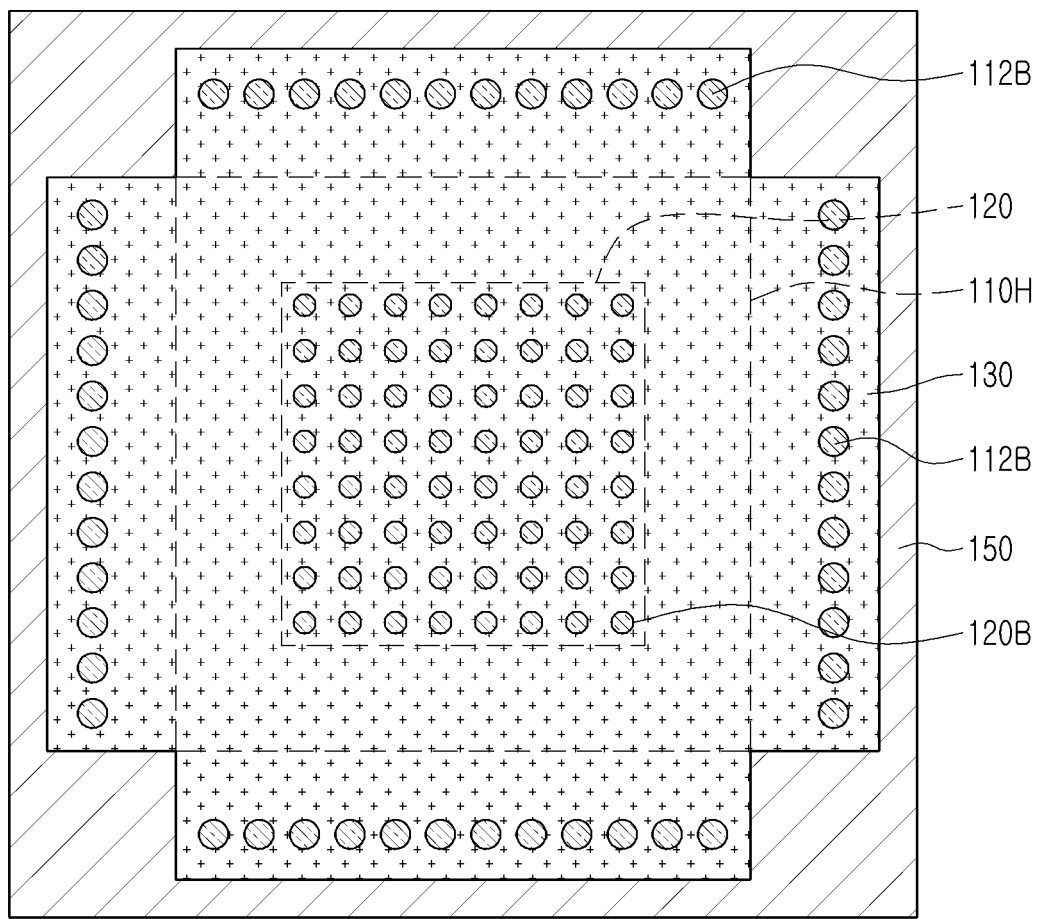

FIGS. 11A and 11B are schematic plan views illustrating another example of a semiconductor package.

Referring to FIG. 11A, the stiffener 150 may be disposed on the outside of the recess portion 110H of the frame 110 on a plane, and may be disposed so as to surround two groups of second connection portions 112B outside of the two surfaces of the semiconductor chip 120. Referring to FIG. 11B, the stiffener 150 may be disposed outside of the recess portion 110H of the frame 110 on a plane, and may be disposed only on the outside of the second connection portion 112B. That is, the stiffener 150 may be disposed along an edge of the frame 110. According to embodiments of FIGS. 11A to 11B, the disposition of the stiffener 150 may be variously modified on a plane, according to the disposition of the second connection portion 112B.

FIG. 12A to 12E are schematic process drawings illustrating a manufacturing example of the semiconductor package of FIG. 9.

Figure 12A:
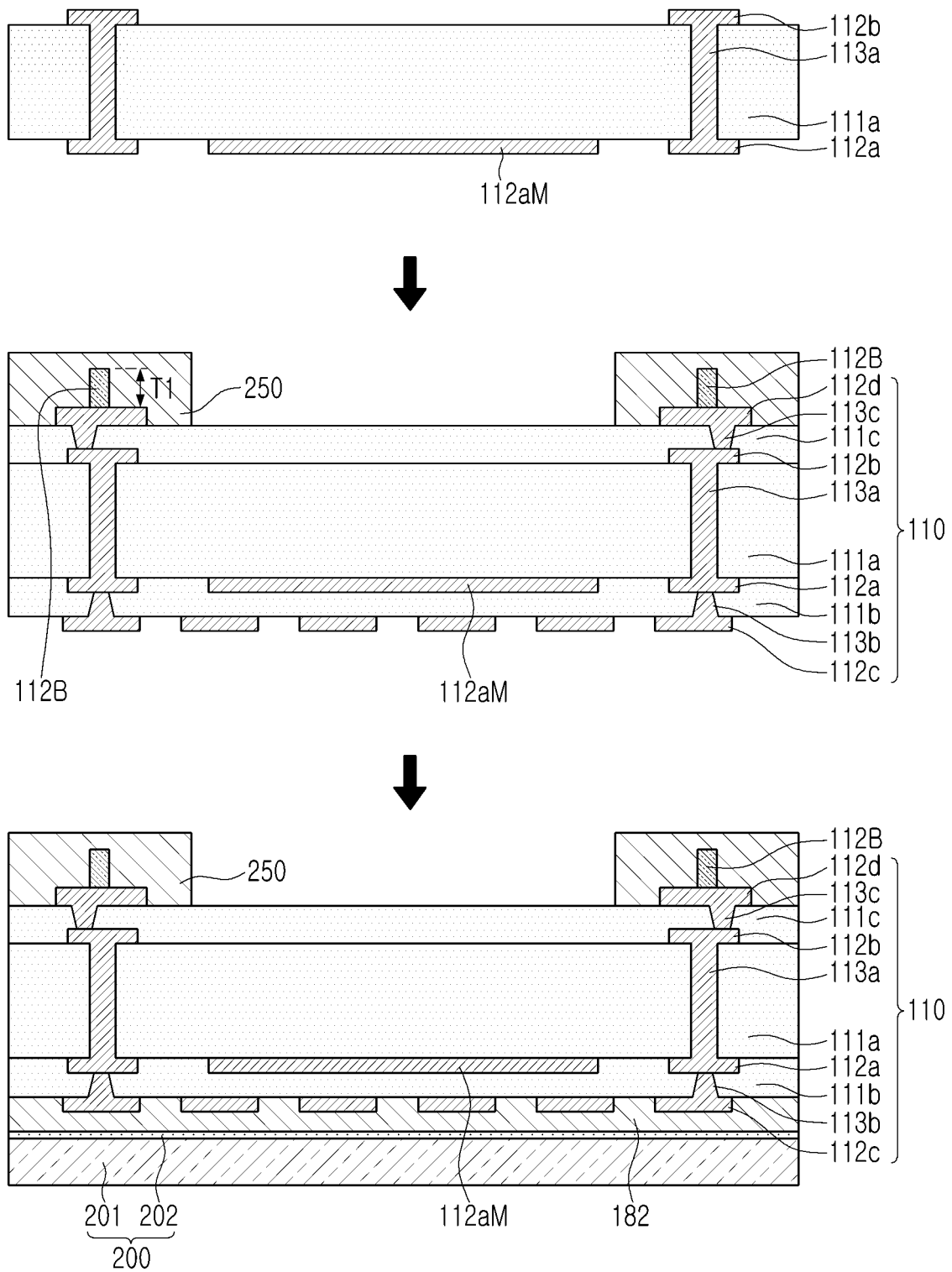
FIG. 12A to 12E are schematic process drawings illustrating a manufacturing example of the semiconductor package of FIG. 9.

Referring to FIG. 12A, first a core insulating layer 111*a* is prepared, using a copper clad laminated (CCL) plate, or the like, first and second wiring layers 112*a* and 112*b* and a stopper layer 112*a*M and a first connection via layer 113*a* may be formed using a known plating process in the core insulating layer 111*a*. A via hole for the first connection via layer 113*a* may be formed using a mechanical drill and/or a laser drill, or the like. Next, first and second build-up insulating layers 111*b* and 111*c* may be formed on both surfaces of the core insulating layer 111*a*, and third and fourth wiring layers 112*c* and 112*d* and second and third connection via layers 113*b* and 113*c* may be formed by using a plating process in the first and second build-up insulating layers 111*b* and 111*c*, respectively. In addition, a second connection portion 112B may be formed on the fourth wiring layer 112*d*, and a dry film 250 such as DFR may be attached on the upper side of the frame 110. The first and second build-up insulating layers 111*b* and 111*c* may be formed by a method of laminating and curing a prepreg, ABF, or the like. A via hole for the second and third connection via layers 113*b* and 113*c* may also be formed using a mechanical drill and/or a laser drill. The second connection portion 112B may have a first height T1, which may be equal to or greater than a height in a final structure. Next, a second passivation layer 182 may be attached to a lower side of the frame 110 prepared by a series of processes, and a carrier film 200 including an insulating layer 201 and a metal layer 202 may be attached on the second passivation layer 182.

Figure 12B:
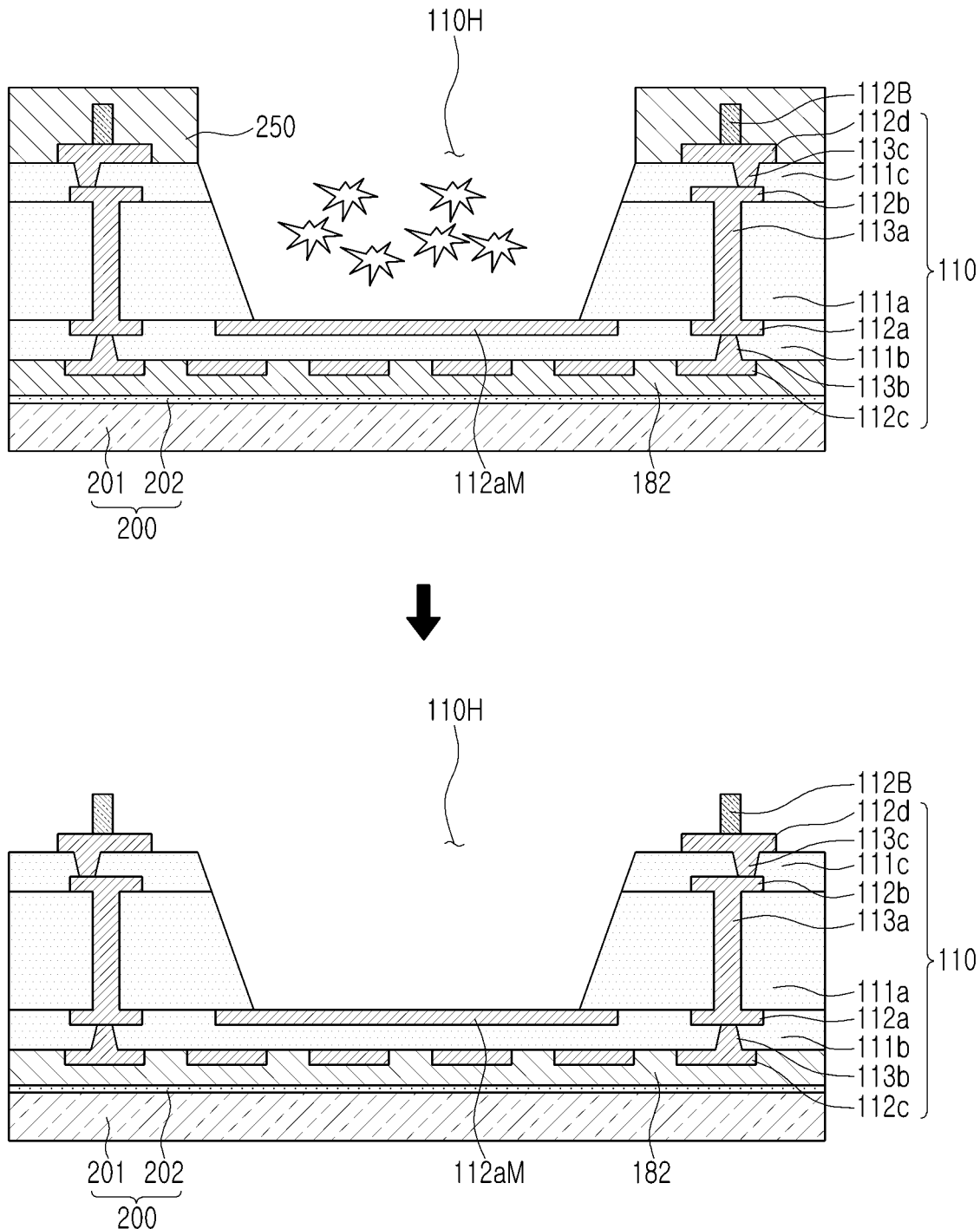

Referring to FIG. 12B, a recess portion 110H penetrating the core insulating layer 111*a* and the second build-up insulating layer 111*c* may be formed using sandblasting, or the like. In this case, the stopper layer 112*a*M may function as a stopper. The formed recess portion 110H may have a tapered cross-sectional shape by a sandblasting method. After the recess portion 110H is formed, the dry film 250 may be removed.

Figure 12C:
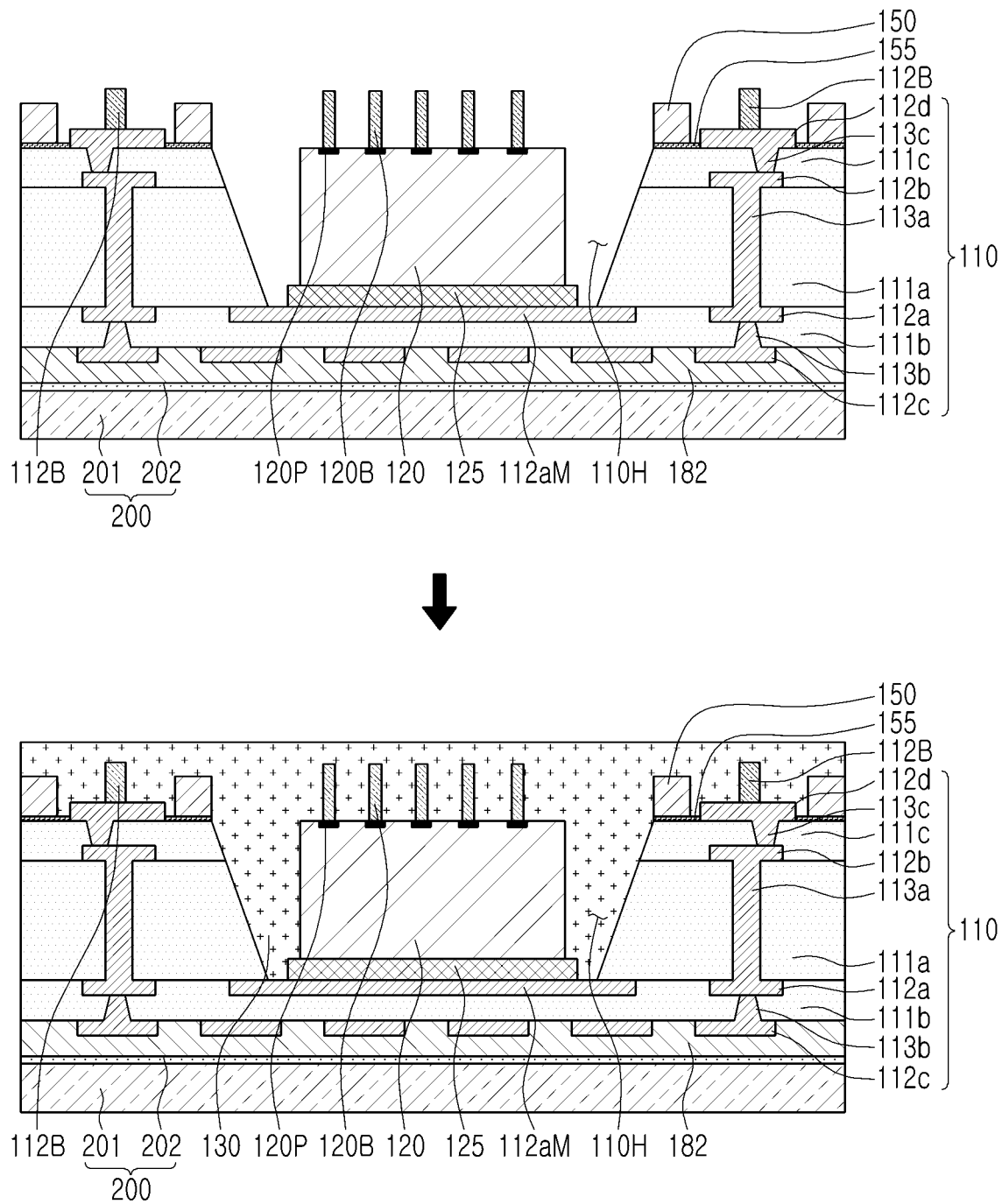

Referring to FIG. 12C, the semiconductor chip 120 may be disposed on the recess portion 110H by attaching the inactive surface to the stopper layer 112*a*M, and the stiffener 150 may be attached to the upper surface of the frame 110 so as to be spaced apart from the uppermost wiring layer 112*d* and the second connection portion 112B. An attachment process of the semiconductor chip 120 may be performed using an adhesive member 125 such as a die attach film (DAF). Meanwhile, the semiconductor chip 120 may be attached on a connection pad 120P in a state in which a first connection portion 120B such as a copper post or a copper pillar, is formed thereon. Alternately, the first connection portion 120B such as a copper post of a copper pillar may be formed on the connection pad 120P of the semiconductor chip 120 after attachment. The stiffener 150 may be formed by processing a plate and then attaching it to the upper surface of the frame 110 using an adhesive layer 155, and the adhesive layer 155 may be applied or attached to the upper surface the frame 110 or the lower surface of the stiffener 150. In the present step, the upper surface of the stiffener 150 may be located at the same height or lower level as upper surfaces of the first and second connection portions 120B and 112B. Next, at least portions each of the frame 110, the semiconductor chip 120, and the first and second connection portions 120B and 112B may be covered using the encapsulant 130, and at least a portion of the recess portion 110H may be filled with the encapsulant 130. The encapsulant 130 may fill a space between the stiffener 150 and the second connection portion 112B and a space between the fourth wiring layer 112d and the stiffener 150. The encapsulant 130 may be formed by laminating and then curing ABF, or the like.

Figure 12D:
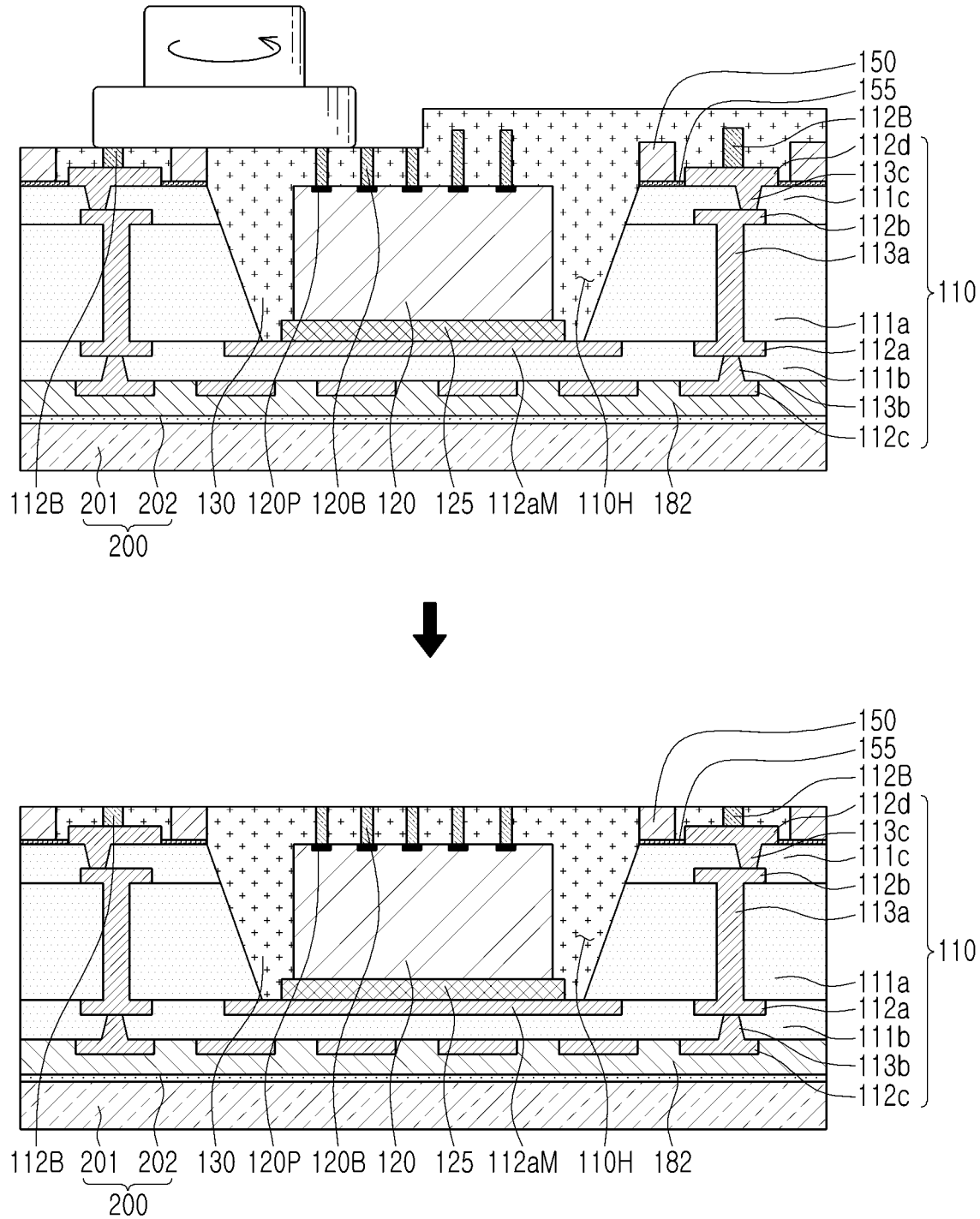

Referring to FIG. 12D, the encapsulant 130 may be ground such that the upper surfaces of the first and second connection portions 120B and 112B and the stiffener 150 are exposed. The upper surface of the encapsulant 130 may be flattened by grinding, and the upper surfaces of the first and second connection portions 120B and 112B and the stiffener 150 are exposed from the upper surface of the encapsulant 130. During the grinding process, when the stiffener 150 is exposed from the upper surface of the encapsulant 130, the grinding process may be stopped due to the relatively large hardness of the stiffener 150. Therefore, the encapsulant 130 may be polished up to the height of the stiffener 150. In addition, the first and second connection portions 120B and 112B may be polished up to the height of the stiffener 150, even when the portions of the first and second connection portions 120B and 112B are polished together during the grinding process.

Figure 12E:
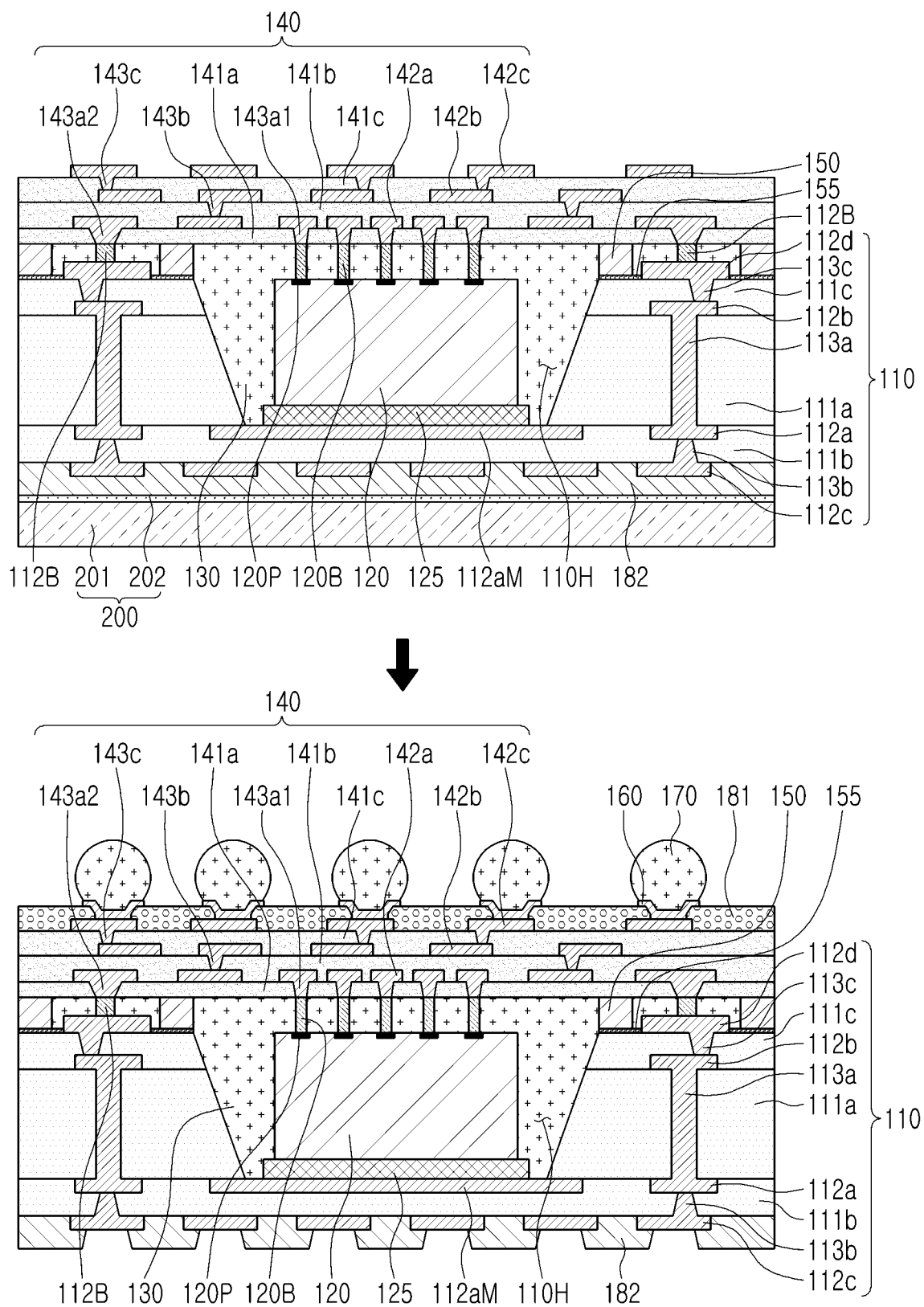

Referring to FIG. 12E, a first insulating layer 141a may be formed by applying and curing a PID on the encapsulant 130, and a first redistribution layer 142a and first vias 143a1 and 143a2 may be formed by a plating process. Subsequently, second and third insulating layers 141b and 141c and second third redistribution layers 142b and 142c, and second and third vias 143b and 143c may be formed. A connection structure 140 may be formed by a series of processes. A via hole for forming the vias 143a, 143b, and 143c may be formed by a photolithography method using exposure and development. Next, the first passivation layer 181 may be formed on the connection structure 140 by laminating ABF, or the like, and then curing the first passivation layer 181, and a carrier film 200 may be removed. In addition, an underbump metal layer 160 may be formed by a known metallization method, and an electrical connection metal 170 may be formed by a reflow process using a solder ball, or the like. The second passivation layer 182 may be patterned such that a portion of the third wiring layer 112c is exposed. The semiconductor package 100 described above may be manufactured by a series of processes.

Figure 13:
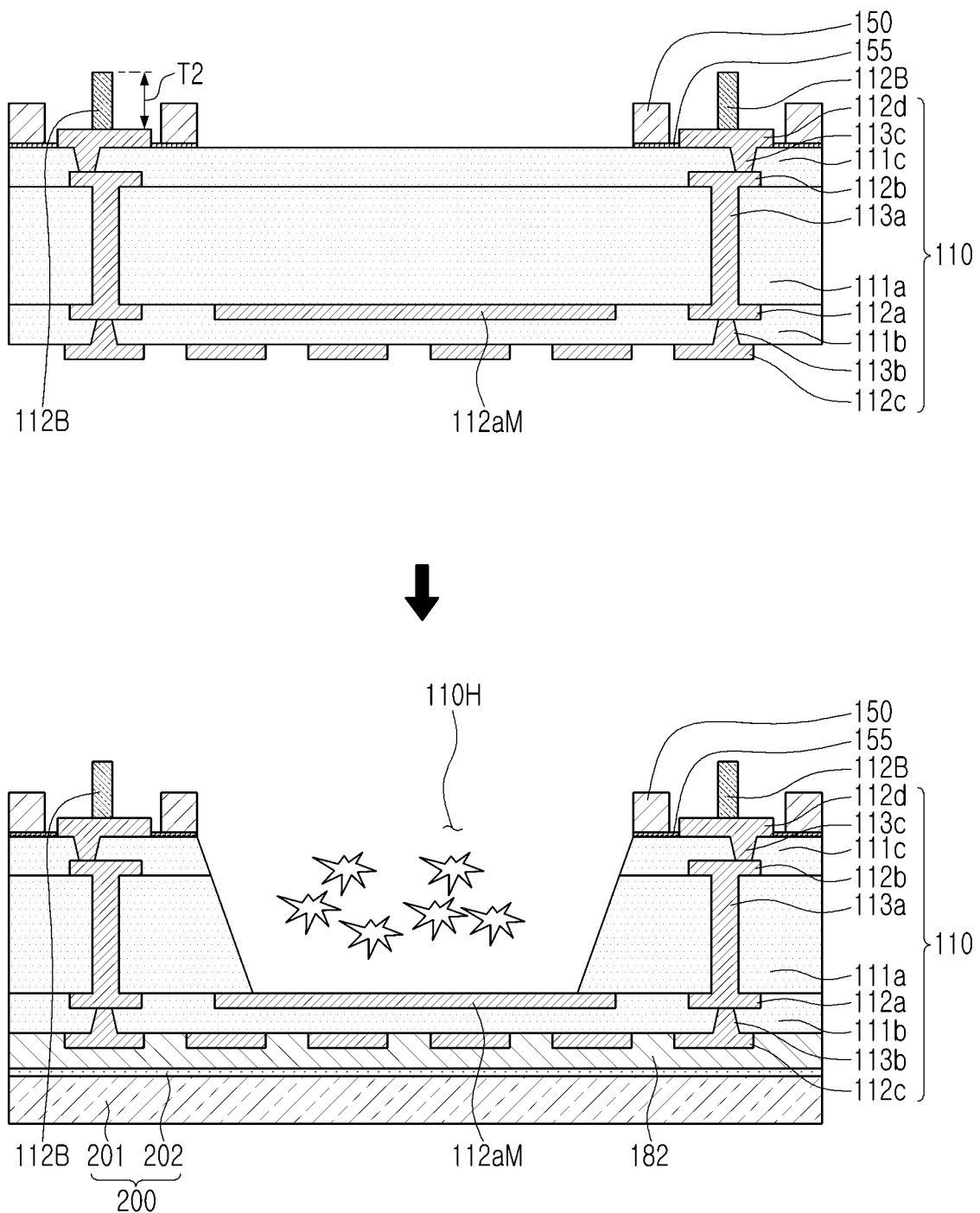
FIG. 13 is a process drawing illustrating another manufacturing example of the semiconductor package of FIG. 9.

FIG. 13 is a processing diagram illustrating another manufacturing example of the semiconductor package of FIG. 9.

Referring to FIG. 13, unlike the manufacturing process described above with reference to FIGS. 12A to 12D, the stiffener 150 may be formed before the recess portion 110H is formed. That is, after the frame 110 is formed as described above with reference to FIG. 12A, the stiffener 150 may be attached on the upper surface of the frame 110. In the present manufacturing example, formation of the dry film 250 formed above the frame 110 may be omitted. This is because the stiffener 150 and the adhesive layer 155 may function as a resist film in a process of forming the recess portion 110H, similar to the dry film 250. However, in this case, since an amount of abrasion of the second connection portion 112B becomes relatively large in the process of forming the recess portion 110H, an initial height T2 of the second connection portion 112B may be formed to be greater than the height T1 in the case of FIG. 12A. Next, after the carrier film 200 is attached on the second passivation layer 182, the recess portion 110H may be formed by using sandblasting, or the like. A subsequent process such as the disposition of the semiconductor chip 120, the formation of the connection structure 140, and the grinding process of the encapsulant 130, and the like, may be performed in the same manner as described above with reference to FIGS. 12C to 12E.

Figure 14:
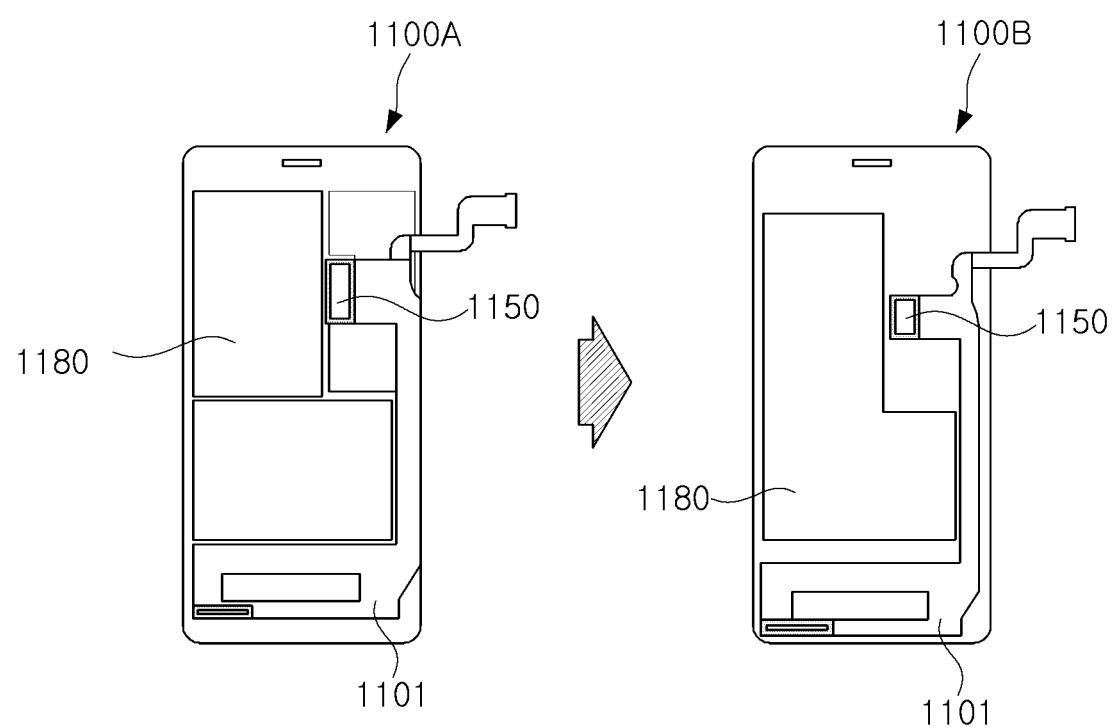
FIG. 14 is a schematic plan view illustrating an effect in a case in which the semiconductor package according to the present disclosure is applied to an electronic device.

FIG. 14 is a schematic plan view illustrating an effect in a case in which the semiconductor package according to the disclosure is applied to an electronic device.

Referring to FIG. 14, recently, as a size of display for mobile devices 1100A and 1100B increases, the necessity of increasing battery capacity is increasing. As the battery capacity increases, an area occupied by the battery 1180 increases. In this regard, a size of a printed circuit board 1101 such as a mainboard is required to be reduced. Thus, due to a reduction in amounting area of a component, an area occupied by a module 1150 including a power management integrated circuit (PMIC) and passive components is gradually decreased. In this case, when the semiconductor package 100 according to an embodiment is applied to the module 1150, a size is able to be reduced. Thus, the area, which becomes smaller as described, above may be effectively used.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

As set forth above, according to an embodiment in the present disclosure, a semiconductor chip is disposed by introducing a frame having a blind recess portion, and when a grinding process for an encapsulant to expose a wiring of the frame and a connection pad of the semiconductor chip is performed, a semiconductor package capable of securing reliability by controlling a thickness to be polished.

While exemplary embodiments have been shown and described above, it will be apparent to those skilled in the art that modifications and variations could be made without departing from the scope of the present invention as defined by the appended claims.

What is claimed is:

1. A semiconductor package, comprising:
    a frame including a plurality of wiring layers electrically connected to each other, and having a recess portion in which a stopper layer is disposed on a bottom surface;
    a semiconductor chip having an active surface on which a connection pad is disposed and an inactive surface opposing the active surface, the inactive surface being disposed in the recess portion and facing the stopper layer;
    a first connection portion disposed on the connection pad;
    a second connection portion disposed on an uppermost wiring layer of the plurality of wiring layers;
    a stiffener disposed on an upper surface of the frame and surrounding at least a portion of the second connection portion, the stiffener being spaced apart from the second connection portion;
    an encapsulant covering at least a portion of each of the frame, the semiconductor chip, the first connection portion, the second connection portion, and the stiffener, and filling at least a portion of the recess portion; and
    a connection structure disposed on the frame and the active surface of the semiconductor chip, and including a redistribution layer electrically connected to the first connection portion and the second connection portion,
    wherein the stiffener has a plate shape having openings and the stiffener completely surrounds the second connection portion in a plan view.

2. The semiconductor package of claim 1, wherein the stiffener comprises a material different from a material of the first connection portion and the second connection portion.

3. The semiconductor package of claim 2, wherein the stiffener is made of a material having a hardness higher than a hardness of the first connection portion and the second connection portion, and the stiffener comprises iron (Fe).

4. The semiconductor package of claim 1, wherein an upper surface of the stiffener, an upper surface of the first connection portion, and an upper surface of the second connection portions are substantially coplanar.

5. The semiconductor package of claim 1, wherein the stiffener is electrically insulated from the first connection portion and the second connection portion.

6. The semiconductor package of claim 1, wherein the second connection portion includes a plurality of second connection portions, and
    the stiffener surrounds the plurality of second connection portions by a predetermined unit.

7. The semiconductor package of claim 1, wherein the stiffener is disposed on an outside of the second connection portion on a plane.

8. The semiconductor package of claim 1, wherein the encapsulant fills a space between the stiffener and the uppermost wiring layer.

9. The semiconductor package of claim 1, wherein the encapsulant fills a space between the stiffener and the second connection portion.

10. The semiconductor package of claim 1, further comprising an adhesive layer between a lower surface of the stiffener and the upper surface of the frame.

11. The semiconductor package of claim 10, wherein the adhesive layer is disposed on an entire upper surface of the frame other than a portion occupied by the uppermost wiring layer.

12. The semiconductor package of claim 10, wherein the stiffener is spaced apart from the frame by the adhesive layer.

13. The semiconductor package of claim 1, wherein the first connection portion and the second connection portion are metal posts, respectively.

14. The semiconductor package of claim 13, wherein each of the first connection portion, the second connection portion, and the stiffener is embedded in the encapsulant such that the upper surfaces thereof are exposed from the encapsulant.

15. The semiconductor package of claim 1, wherein a wall surface of the recess portion has an inclination, and
    the inactive surface of the semiconductor chip is attached to the stopper layer by an adhesive member.

16. The semiconductor package of claim 1, wherein the stiffener extends from outer edges of an uppermost insulating layer of the frame toward the uppermost wiring layer.

17. A semiconductor package, comprising:
- a frame including a plurality of wiring layers electrically connected to each other, and having a recess portion in which a stopper layer is disposed on a bottom surface;
- a semiconductor chip having an active surface on which a connection pad is disposed and an inactive surface opposing the active surface, the inactive surface being disposed in the recess portion and facing the stopper layer;
- a first connection portion disposed on the connection pad;
- a second connection portion disposed on an uppermost wiring layer of the plurality of wiring layers;
- a stiffener being spaced apart from the second connection portion and disposed on an upper surface of the frame, and including a material different from a material of the first connection portion and the second connection portion;
- an encapsulant covering at least a portion of each of the frame, the semiconductor chip, the first connection portion, the second connection portion, and the stiffener, and filling at least a portion of the recess portion; and
- a connection structure disposed on the frame and the active surface of the semiconductor chip, and including a redistribution layer electrically connected to the first connection portion and the second connection portion, wherein the stiffener comprises iron (Fe).

18. The semiconductor package of claim 17, wherein the stiffener has a plate shape having one or more openings, in which the second connection portion is disposed.

19. The semiconductor package of claim 17, wherein the stiffener is made of a material having a hardness higher than a hardness of the first connection portion and the second connection portion.

20. The semiconductor package of claim 17, wherein an upper surface of the stiffener, an upper surface of the first connection portion, an upper surface of the second connection portion, and an upper surface the encapsulant are substantially coplanar.

* * * * *